(12) United States Patent
Zoellin et al.

(10) Patent No.: US 9,369,809 B2
(45) Date of Patent: Jun. 14, 2016

(54) MEMS COMPONENT FOR GENERATING PRESSURE PULSES

(71) Applicant: Robert Bosch GmbH, Stuttgart (DE)

(72) Inventors: Jochen Zoellin, Muellheim (DE); Ricardo Ehrenpfordt, Korntal-Muenchingen (DE); Rolf Scheben, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 168 days.

(21) Appl. No.: 14/133,134

(22) Filed: Dec. 18, 2013

(65) Prior Publication Data
US 2014/0169594 A1   Jun. 19, 2014

(30) Foreign Application Priority Data
Dec. 18, 2012 (DE) .......................... 10 2012 223 605

(51) Int. Cl.
| | |
|---|---|
| H04R 19/02 | (2006.01) |
| H04R 19/00 | (2006.01) |
| B06B 1/02 | (2006.01) |
| H04R 15/00 | (2006.01) |
| H04R 17/00 | (2006.01) |
| B81B 5/00 | (2006.01) |
| H04R 9/06 | (2006.01) |
| H04R 11/02 | (2006.01) |

(52) U.S. Cl.
CPC ............ *H04R 19/005* (2013.01); *B06B 1/0292* (2013.01); *H04R 19/02* (2013.01); *B81B 5/00* (2013.01); *B81B 2201/0264* (2013.01); *B81B 2203/05* (2013.01); *H04R 9/06* (2013.01); *H04R 11/02* (2013.01); *H04R 15/00* (2013.01); *H04R 17/00* (2013.01); *H04R 2201/003* (2013.01); *H04R 2217/03* (2013.01); *H04R 2460/03* (2013.01)

(58) Field of Classification Search
CPC .............. B81B 2201/0264; B81B 2201/0257; B81B 2201/0292; B81B 3/0027; B81B 3/0029; B81B 5/00; B81B 7/02; B81B 2201/003; B81B 2203/00; B81B 2203/01; B81B 2203/05; H04R 19/005; H04R 19/02
USPC ........................................................ 381/190
See application file for complete search history.

(56) References Cited

U.S. PATENT DOCUMENTS

| | | | | |
|---|---|---|---|---|
| 5,962,787 A | * | 10/1999 | Okada ..................... | G01P 15/18 73/514.16 |
| 7,640,805 B2 | * | 1/2010 | Diamond ............ | B81C 1/00246 73/514.32 |

FOREIGN PATENT DOCUMENTS

DE        102010029936    * 12/2011    ............. H04R 19/04

*Primary Examiner* — Davetta W Goins
*Assistant Examiner* — Oyesola C Ojo
(74) *Attorney, Agent, or Firm* — Norton Rose Fulbright US LLP

(57) ABSTRACT

A MEMS component for generating pressure pulses is provided, its micromechanical structure including at least three function levels: a first function level in which at least one stationary trench structure is implemented, a second function level, which is implemented above the first function level and includes at least one triggerable displacement element as well as through-openings as pressure outlet openings, the displacement element protruding into the trench structure and being movable in parallel with the function levels, whereby positive and negative pressure pulses are generated, and a third function level, which is implemented above the second function level and includes at least one triggerable cover element for at least one part of the pressure outlet openings in the second function level.

8 Claims, 4 Drawing Sheets

MEMS COMPONENT FOR GENERATING PRESSURE PULSES

FIELD OF THE INVENTION

The present invention relates to a MEMS (microelectromechanical system) component for generating pressure pulses.

BACKGROUND INFORMATION

Such MEMS components are used, for example, as loudspeakers as part of a wide variety of applications. Due to their miniaturized design and the possibility of integration of additional functionalities at very low manufacturing costs, MEMS loudspeaker components are becoming increasingly important economically.

Most of the MEMS components on the market for detection and/or generation of pressure pulses are equipped with a preferably large-scale diaphragm in parallel to the plane of the chip or substrate. In the configuration as a microphone, this diaphragm is excited to vertical (out-of-plane) vibrations by the sound pressure. Deflections of the diaphragm are then detected capacitively, for example, as a microphone signal. This principle is applied conversely in the case of the configuration as a loudspeaker. In this case, the diaphragm is excited capacitively, for example, to vertical (out-of-plane) vibrations, resulting in pressure pulses, i.e., sound waves.

These diaphragm-based MEMS components have proven to be problematical in many regards.

Suspension of the diaphragm necessitates bending or warping of the diaphragm, which results in nonlinearities of the microphone signal or the loudspeaker signal and thus has negative effects on the performance of the component. The thinner the diaphragm, the better is the performance of the component. Accordingly, the diaphragm is very fragile and sensitive to mechanical stresses such as impact and knocking effects. The performance of the component is thus in contrast with its robustness.

The detection direction or the drive direction and the displacement movement are similarly oriented in the case of diaphragm-based components. The given facts of the volume displacement are thus linked to the given facts of the detection or drive. In the case of a capacitive loudspeaker component, this results in the loudspeaker performance essentially depending on the energy consumption of the component. In other words, the loudspeaker performance is better, the larger the displacement volume, which is determined here by the gap distance between the diaphragm and the counter electrode. However, the greater the gap distance, the higher is also the energy consumption since high electrostatic forces are needed to trigger the diaphragm accordingly.

German Published Patent Appln. No. 10 2010 029 936 provides a capacitive MEMS microphone component whose layered structure includes at least three function layers. A sound opening, which opens into a cavity beneath the first function layer, is provided in the first function layer. This cavity extends essentially over the second function layer, in which a diaphragm and a counter element are formed, namely in such a way that the diaphragm delimits the cavity on at least one side and is deflectable in the plane of the layer. The diaphragm functions as the first electrode of a microphone capacitor, and the counter element functions as the carrier of a counter electrode of the microphone capacitor. At least one vent opening for the microphone structure is formed beneath the cavity in the third function layer.

In the case of the MEMS microphone component described here, the sound pressure acting on the component perpendicularly to the planes of the layers produces a diaphragm movement oriented in parallel to the planes of the layers of the component.

SUMMARY

The present invention provides a concept for MEMS components for generating pressure pulses, utilizing the deflection of the sound pressure described in German Published Patent Appln. No. 10 2010 029 936 to decouple the drive direction and the direction of the displacement movement; this also offers the option of controlling the polarity of the pressure pulses thereby generated.

The micromechanical structure of the MEMS component according to the present invention therefore has three function levels. At least one stationary trench structure is implemented in a first function level. The second function level is situated above the first function level and includes at least one triggerable displacement element as well as through-openings as pressure outlet openings for the pressure pulses generated. The displacement element protrudes into the trench structure and is movable in parallel with the function levels, whereby both positive and negative pressure pulses are generated. The third function level is implemented above the second function level and includes at least one triggerable cover element for at least one part of the pressure outlet openings in the second function level.

The component concept according to the present invention thus provides for pressure pulses to be generated by excitation of a displacement element, which is uncovered in the layer structure of the component within a trench structure and is set in vibration in parallel with the plane of the chip. The pressure pulses generated in this way emerge from the component structure through the pressure outlet openings, i.e., perpendicularly to the direction of movement of the displacement element. According to the present invention, the sequence of pressure pulses emerging from the pressure outlet openings is influenced with the aid of the cover elements in the third function level. The position of the cover elements is therefore regulated as a function of the movement or the direction of movement of the displacement element. For example, negative pressure pulses may be suppressed in a targeted manner in this way to prevent compensation of the sound waves thereby generated and undesirable heterodyne effects.

The concept according to the present invention has proven to be advantageous in many regards. For example, the component structure is comparatively robust since fragile diaphragm structures may be omitted. Furthermore, the trench structure of the first function level functions as overload protection for the displacement element of the second function level. Both the trench structure and the displacement element resemble the well-characterized sensor structures of micromechanical acceleration sensors and yaw rate sensors in both shape and aspect ratio. To manufacture such structures, it is thus possible to resort to known and tested manufacturing processes. Thus, for example, even very small gaps between the displacement element and the trench wall may be created, which is particularly advantageous from the standpoint of an electrostatic drive. In this case, the displacement volume required for the desired performance may be ensured by an increased structural depth. These measures do not detract from the stability and robustness of the component structure but instead promote them.

Since the design of the individual function levels may be determined lithographically, the component concept according to the present invention offers a very great design freedom. The component structure may be implemented exclusively by using the methods of surface micromechanics. However, it is also possible to implement individual structural elements, for example, the trench structure of the first function level, in the substrate using the methods of bulk micromechanics. In this case, the substrate contributes toward generation of the signal, whereby either a higher signal level is achieved or the chip size may be reduced.

There are fundamentally various options for implementation of the concept according to the present invention of a loudspeaker component, with regard to the layout of individual function levels and also with regard to the implementation of the triggering of the displacement element and cover elements.

In a preferred specific embodiment of the present invention, vent openings are formed in the first function level of the MEMS component. A local overpressure or underpressure, which occurs due to the movement of the displacement element in an area of the component structure, may be dissipated through these vent openings on the rear side of the component or in a housing, for example. This has proven to be advantageous in particular when the emergence of pressure pulses is prevented with the aid of the cover elements. These vent openings may be formed at the side of the trench structure or also in the bottom area of a trench, depending on the type of pressure outlet openings in the second function level and the design of the cover elements in the third function level.

The displacement element of a MEMS component according to the present invention may be excited to either a translatory movement or a rotatory "in-plane" movement. This depends essentially on the type of suspension or connection of the displacement element to the component structure. Thus, the displacement element may be tied into the layer structure of the component structure via a diaphragm or spring elements, for example. It may be suspended on all sides, multiple sides, two sides or only one side. The direction of movement is also determined by the triggering of the displacement element, i.e., by the type of triggering and the configuration of the corresponding electrical circuit elements. This excitation and triggering of the displacement element may take place electrostatically, piezoelectrically, magnetostatically and/or electromagnetically.

In one advantageous specific embodiment of the present invention, the displacement element is designed like a bar and the length and height of this bar-shaped displacement element are coordinated with the length and depth of the trench structure. This design variant is not only simple to create using known structuring methods in the layer structure of a semiconductor element, but also permits an uncomplicated triggering with low energy consumption and good loudspeaker performance.

Spacers are advantageously formed on the displacement element and/or on the trench wall. This makes it possible to prevent the displacement element from adhering to the trench wall in end-position contact. Such spacers ensure that a residual air cushion will always remain between the trench wall and the displacement element.

As mentioned previously, a MEMS component according to the present invention for generating pressure pulses includes at least one triggerable cover element with which the emergence of pressure pulses in at least one part of the pressure outlet openings is preventable. This cover element is therefore moved over the corresponding pressure outlet openings in the third function level. Here again, the type of movement and in particular the direction of movement depend on the type of suspension or connection of the cover element in the component structure and on the type of drive means or trigger means. These may be designed for an in-plane movement of the cover element within the third function level or for an out-of-plane movement perpendicular to the third function level.

For such an out-of-plane movement, the cover element could be implemented, for example, in the form of a triggerable rocker structure which is suspended via a torsion spring structure in the third function level and is deflectable out of this level. This variant is explained in greater detail below with reference to one exemplary embodiment.

DETAILED DESCRIPTION

Figure 1A:
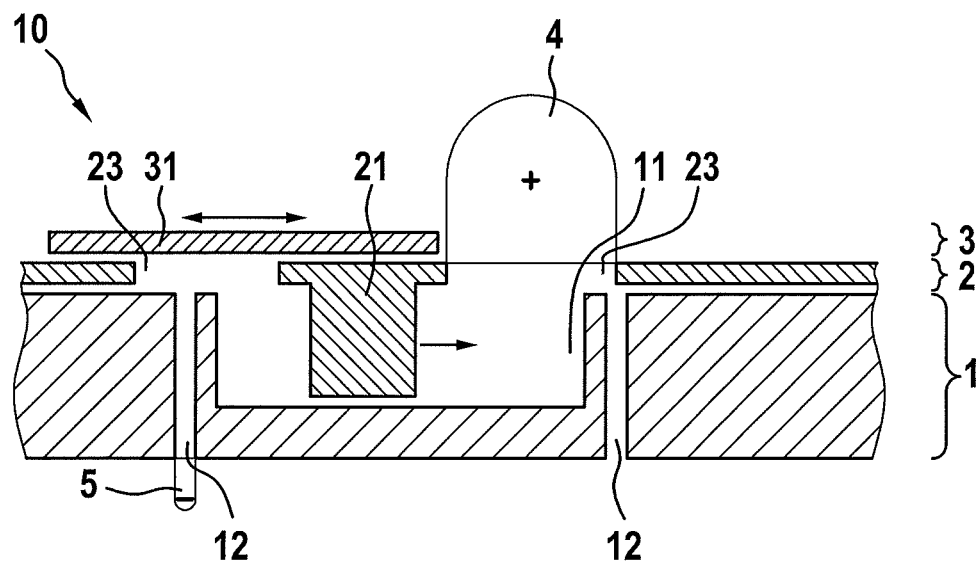
FIGS. 1a, 1b show a detail of a schematic sectional view through the three function levels of a first MEMS component 10 according to the present invention at different points in time during the pressure pulse generation.
Figure 1B:
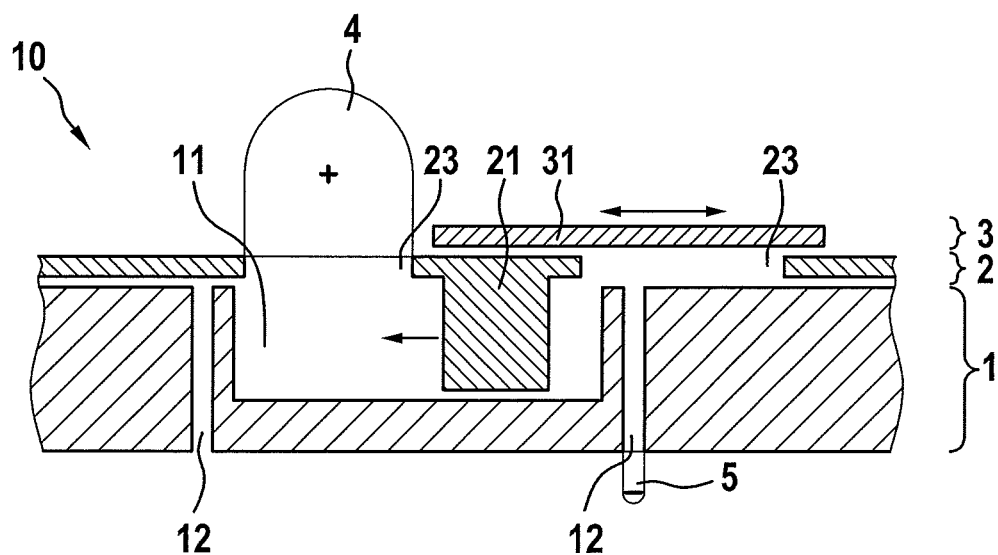

FIGS. 1a and 1b illustrate the design of the component structure of a MEMS loudspeaker component 10 according to the present invention in three function levels 1 through 3.

First function level 1 here is formed in the carrier substrate of the component structure. A trench structure 11 having an essentially rectangular cross-sectional area was therefore introduced into the substrate surface. Within the scope of this structuring, vent openings 12 in the form of through-openings in substrate 1 were also created here. These vent openings 12 are situated at the side of trench structure 11 in the present exemplary embodiment.

Second function level 2 is implemented above first function level 1 in a layer structure on carrier substrate 1. A triggerable displacement element 21, which is connected to the layer structure via spring elements (not shown in detail here), is formed in this second function level 2. Through-openings 23 which function as pressure outlet openings 23 are formed in the area of this spring suspension. Displacement element 21 protrudes into trench structure 11 of first function level 1. It is bar-shaped in the exemplary embodiment shown here. The length and height of this bar-shaped displacement element 21 are coordinated with the length and depth of trench structure 11. However, trench structure 11 is much wider than bar-shaped displacement element 21, whereby displacement element 21 may be moved laterally back and forth within trench structure 11. The triggering of displacement element 21 for this translatory movement in the component plane may be electrostatic, piezoelectric, magnetostatic and/or electromagnetic. However, the circuit means required for this are not described here.

Third function level 3 is implemented above second function level 2 in the layer structure of MEMS component 10. In this function level 3, at least one triggerable cover element 31 for at least one part of pressure outlet openings 23 is formed in second function level 2. In the present exemplary embodiment, the suspension of cover element 31 and the circuit means for triggering an in-plane movement of cover element 31 are both designed within third function level 3, which will be explained in greater detail below in conjunction with FIG. 1c.

The generation of pressure pulses with the aid of MEMS component 10 is illustrated by a combined view of FIGS. 1a and 1b. The arrows show the direction of movement of displacement element 21 and of cover element 31. Positive pressure pulses 4 are generated by the movement of displacement element 21 within trench structure 11 in the direction of movement of displacement element 21, whereas an underpressure, i.e., negative pressure pulses 5, occur(s) on the rear side of displacement element 21. Displacement element 21 moves to the right in FIG. 1a. An overpressure develops in trench structure 11 at the right of displacement element 21 accordingly, which emerges as a positive pressure pulse 4 from pressure outlet opening 23 at the right of displacement element 21. Since pressure outlet opening 23 on the left side of displacement element 21 is covered by cover element 31 in third function level 3, corresponding negative pressure pulse 5 on the left side of displacement element 21 cannot emerge from the front side of the component but instead is diverted onto the rear side of the component via vent opening 12 at the left of trench structure 11. This prevents two pressure pulses 4 and 5 from mutually compensating one another.

Through appropriate triggering of cover element 31 out of cycle with displacement element 21, negative pressure pulse 5 is also diverted onto the rear side of the component in the reverse movement of displacement element 21, as shown in FIG. 1b. Cover element 31 is moved to the right, while displacement element 21 is moved to the left. Pressure outlet opening 23 at the left of displacement element 21 is therefore uncovered, while pressure outlet opening 23 at the right of displacement element 21 is covered. Now a positive pressure pulse 4 emerging from uncovered pressure outlet opening 23 to the left of displacement element 21 is formed to the left of displacement element 21, according to the direction of movement of displacement element 21, while corresponding negative pressure pulse 5 at the right side of displacement element 21 is diverted via vent opening 12 at the right of trench structure 11 onto the rear side of the component.

Figure 1C:
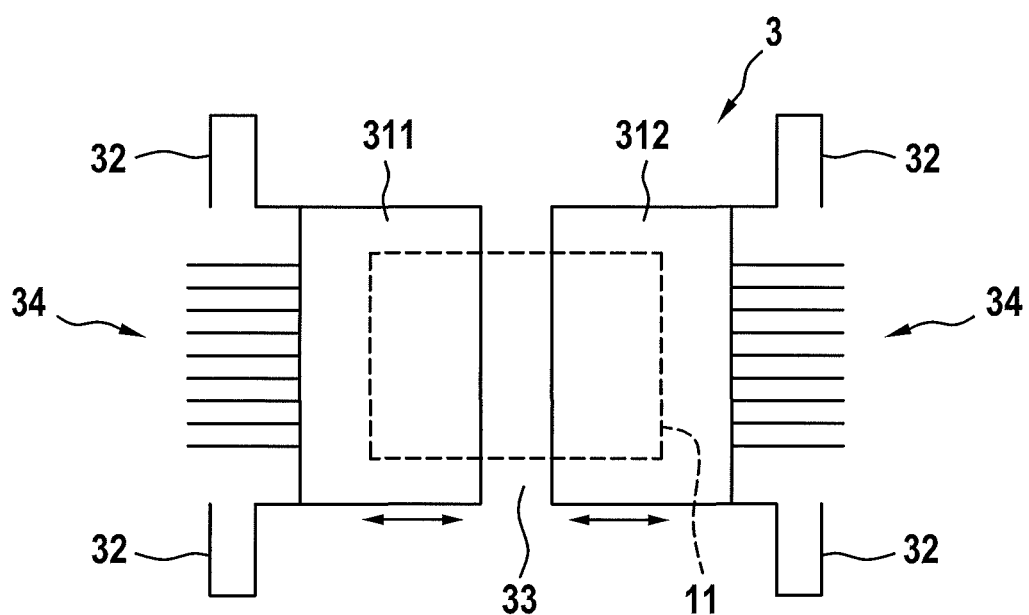
FIG. 1c illustrates the triggering of the cover elements of this MEMS component 10.

FIG. 1c shows a top view of third function level 3 of a MEMS component 10, which may also be referred to as a control level. The shape and position of rectangular trench structure 11 in first function level 1 beneath this level is shown with dashed lines. In the present exemplary embodiment, two plate-type cover elements 311 and 312 are formed in function level 3, which covers the entire trench structure 11 in first function level 1 except for a central gap 33. Cover elements 311 and 312 are each tied into the layer structure of third function level 3 on two opposite sides via U-spring elements 32 and may be moved to the right and left in the present exemplary embodiment in relation to trench structure 11 with the aid of electrostatic drive means 34, for example, a plate or comb capacitor configuration. In the process, the size and, if necessary, also the position of central gap 33 change, whereby pressure outlet openings 23 in second function level 2 are optionally covered or may also be uncovered. The movement of cover elements 311 and 312 and thus the size and, if necessary, the position of central gap 33 are regulated independently of the movement of displacement element 21, but in coordination with this movement to generate defined sound waves.

Figure 2A:
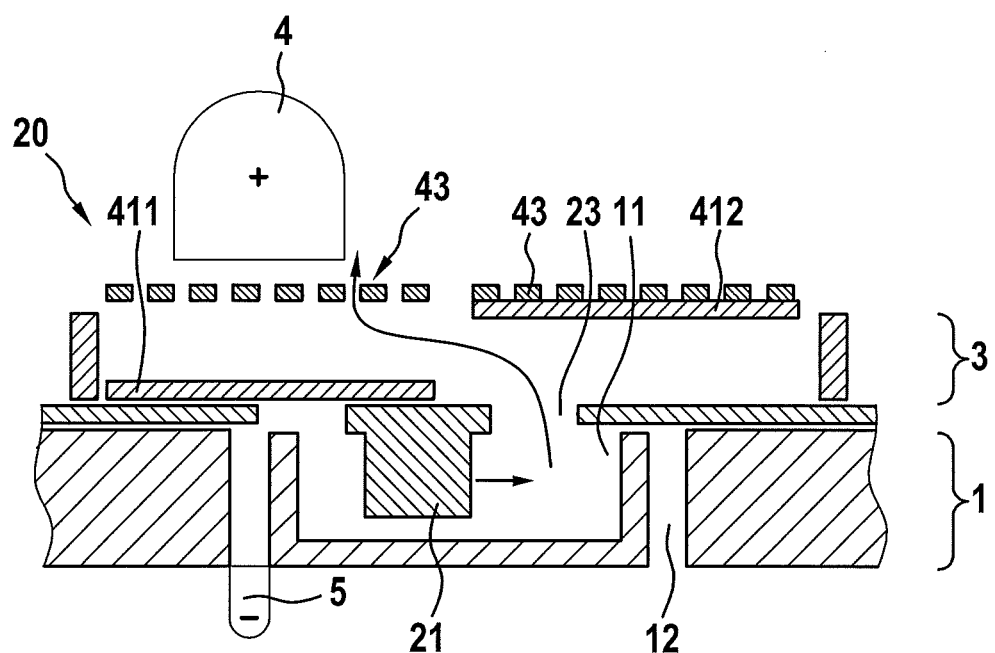
FIG. 2a shows a detail of a schematic sectional view through the three function levels of a second MEMS component 20 according to the present invention.

The component structure of a second MEMS loudspeaker component 20 according to the present invention, as illustrated in FIG. 2a, differs from the structure of MEMS component 10 described above only in third function level 3. Therefore, only this part of MEMS component 20 is described below. Reference is made to the description of FIGS. 1a and 1b with respect to first and second function levels 1 and 2.

Figure 2B:
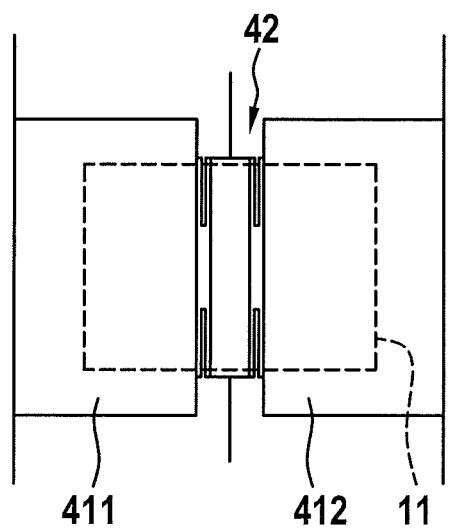
FIG. 2b illustrates the triggering of the cover elements of this MEMS component 20.

In the case of MEMS component 20, third function level 3 is also implemented above second function level 2 and includes at least one triggerable cover element for at least one part of pressure outlet openings 23 in second function level 2. However, the suspension of cover element(s) 411, 412 and the circuit means for triggering in the case of MEMS component 20 are not designed for an in-plane movement within third function level 3 but instead are designed for an out-of-plane movement perpendicular to third function level 3. Two partial plates 411 and 412, which are suspended like a rocker via a torsion spring structure 42 in third function level 3, each covering one-half of trench structure 11, function here as cover elements 411 and 412. This is illustrated in FIG. 2b in particular. Each of two partial plates 411 and 412 together with an electrode 43 situated above it in the layer structure forms a trigger capacitor, whereby each of two partial plates 411, 412 is deflectable simply by applying a corresponding voltage perpendicular to the component plane. Since two partial plates 411 and 412 are linked via torsion spring 42, the other partial plate is deflected in the opposite direction. Pressure outlet openings 23 may therefore optionally be covered or uncovered over half of trench structure 11, while pressure outlet openings 23 over the other half of trench structure 11 accordingly are covered or uncovered.

In FIG. 2a, displacement element 21 moves to the right. Accordingly, an overpressure develops in trench structure 11 at the right of displacement element 21, which emerges as a positive pressure pulse 4 from pressure outlet opening 23 at the right of displacement element 21 since partial plates 412 above that were raised electrostatically while the other partial plate 411 was thereby lowered. Accordingly, pressure outlet opening 23 is covered on the left side of displacement element 21, whereby the corresponding negative pulse 5 on the left side of displacement element 21 cannot emerge from the front side of the component. Instead of that, negative pressure pulse 5 is diverted onto the rear side of the component through vent opening 12 at the left of trench structure 11. This prevents two pressure pulses 4 and 5 from mutually compensating one another.

Figure 3A:
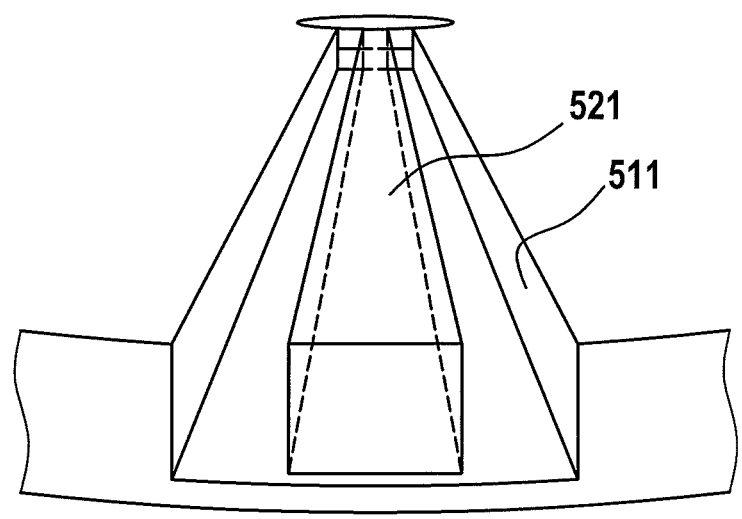
FIG. 3a shows a perspective partial view of another MEMS component 30 according to the present invention.
Figure 3B:
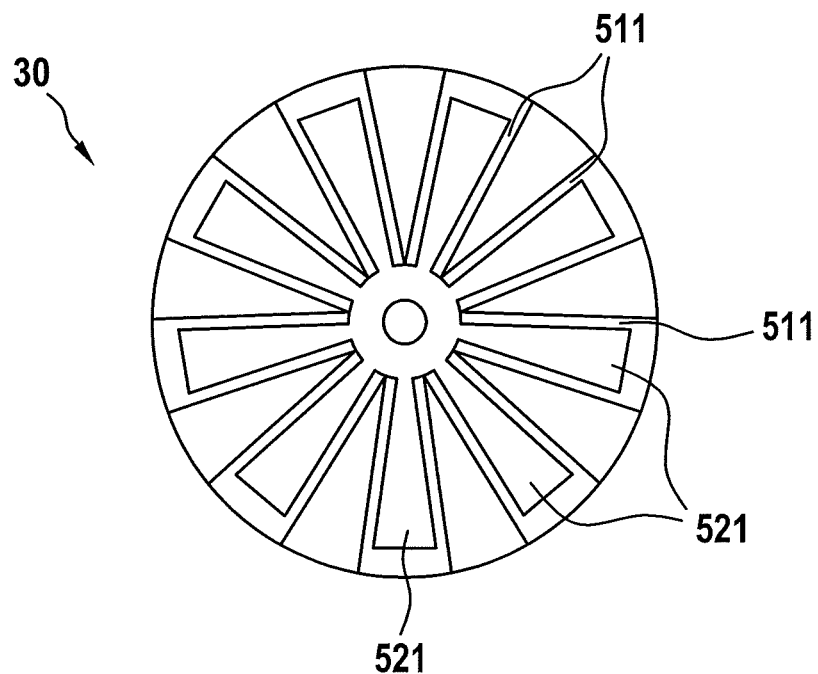
FIG. 3b shows a top view of the trench structure in the first function level having a corresponding arrangement of displacement elements of this MEMS component 30.

With two MEMS components 10 and 20, bar-shaped displacement element 21 is moved by a translatory movement within trench structure 11 of first function level 1. FIGS. 3a and 3b illustrate that the displacement element(s) of a MEMS component 30 according to the present invention may also be excited to a rotatory in-plane movement when the displacement elements are connected suitably to the layer structure of the component structure and suitable drive means are present.

FIG. 3a shows a bar-shaped displacement element 521, which protrudes into a trench structure 511 in the form of a segment of a circle. Displacement element 521 is suspended on only one side, whereby it is pivotable about its suspension point within trench structure 511. The top view of the first function level of a MEMS component 30 according to the present invention illustrated in FIG. 3b shows a circular configuration of such trench structures 511 together with corresponding displacement elements 521. It is thus possible, for example, to generate a succession of ultrasonic pulses, which are in the audible range when superimposed.

What is claimed is:

1. A MEMS component for generating pressure pulses, comprising:
a micromechanical structure including at least three function levels, wherein:
a first function level includes at least one stationary trench structure,
a second function level is implemented above the first function level and includes at least one triggerable displacement element and through-openings as pressure outlet openings, the displacement element protruding into the trench structure and being movable in parallel with the function levels, whereby positive and negative pressure pulses are generated, and
a third function level is implemented above the second function level and includes at least one triggerable cover element for at least one part of the pressure outlet openings in the second function level; and
a trigger arrangement, wherein the trigger arrangement and a suspension of the displacement element in the second function level permit one of a translatory movement and a rotatory movement in parallel to the function levels.

2. The MEMS component as recited in claim 1, further comprising vent openings formed in the first function level.

3. The MEMS component as recited in claim 1, wherein a triggering of the displacement element is at least one of electrostatic, piezoelectric, magnetostatic, and electromagnetic.

4. The MEMS component as recited in claim 1, wherein the displacement element is bar-shaped and a length and a height of the bar-shaped displacement element are coordinated with a length and a depth of the trench structure.

5. A MEMS component for generating pressure pulses, comprising:
a micromechanical structure including at least three function levels, wherein:
a first function level includes at least one stationary trench structure,
a second function level is implemented above the first function level and includes at least one triggerable displacement element and through-openings as pressure outlet openings, the displacement element protruding into the trench structure and being movable in parallel with the function levels, whereby positive and negative pressure pulses are generated, and
a third function level is implemented above the second function level and includes at least one triggerable cover element for at least one part of the pressure outlet openings in the second function level; and
at least one spacer formed on at least one of the displacement element and the trench wall, the at least one spacer preventing the displacement element from adhering to the trench wall and ensuring a residual air cushion between the trench wall and the displacement element.

6. The MEMS component as recited in claim 1, wherein the trigger arrangement and a suspension of the cover element in the third function level are designed for an in-plane movement within the third function level.

7. The MEMS component as recited in claim 1, wherein the trigger arrangement and a suspension of the cover element in the third function level are designed for an out-of-plane movement perpendicular to the third function level.

8. The MEMS component as recited in claim 7, wherein the cover element includes a triggerable rocker structure suspended via a torsion spring structure in the third function level and deflectable out of the third function level.

* * * * *